Figure 1:
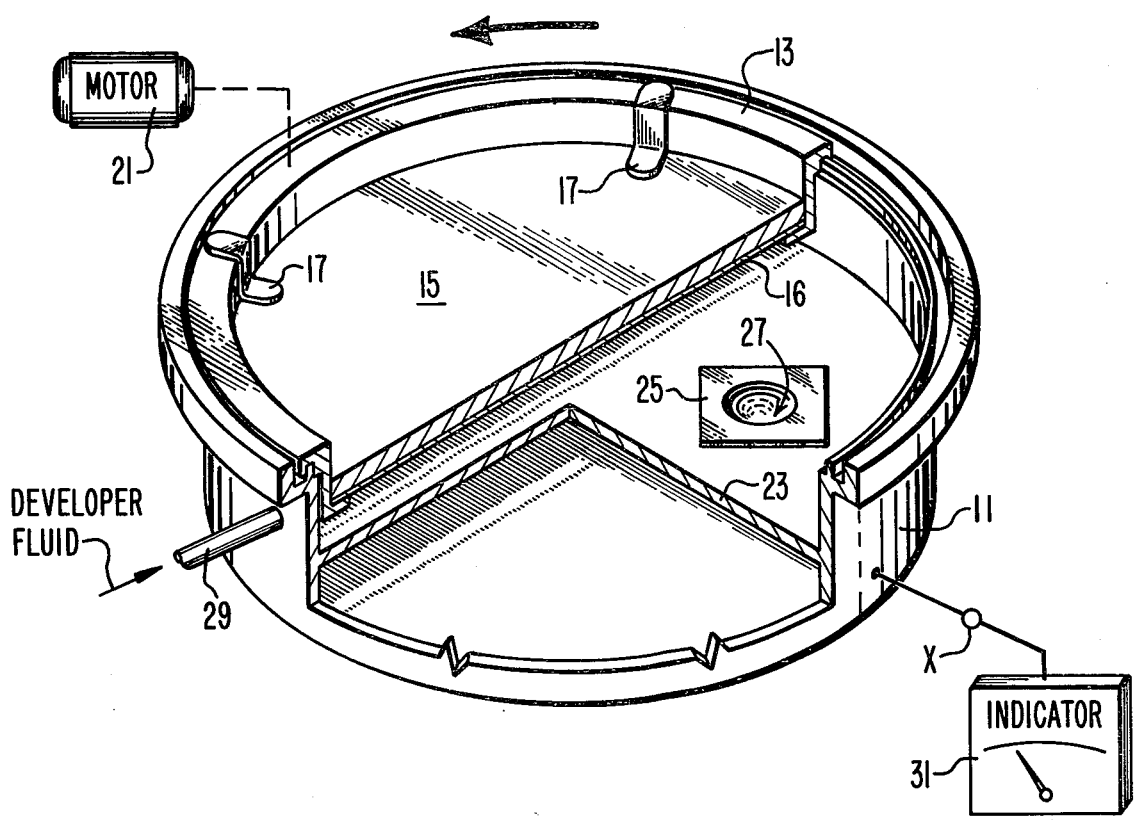

United States Patent [19]

Lin

[11] 4,136,940
[45] Jan. 30, 1979

[54] RESIST DEVELOPMENT CONTROL SYSTEM

[75] Inventor: Lawrence H. Lin, Pennington, N.J.

[73] Assignee: RCA Corporation, New York, N.Y.

[21] Appl. No.: 862,192

[22] Filed: Dec. 19, 1977

[51] Int. Cl.$^2$ ............................................. G03D 13/00
[52] U.S. Cl. .................................... 354/298; 354/317;
134/113; 134/140; 118/8
[58] Field of Search ....................... 354/298, 317, 323;
134/1, 18, 56, 57 R, 58 R, 113, 140, 149, 201;
118/7, 8, 9, 10; 427/8, 264, 273; 179/100.4 C,
100.1 B

[56] References Cited

U.S. PATENT DOCUMENTS

| | | | |
|---|---|---|---|
| 3,663,724 | 5/1972 | Benton et al. | 134/113 |
| 3,702,277 | 11/1972 | Lerner | 118/8 |
| 3,842,194 | 10/1974 | Clemens | 179/100.1 B |
| 3,943,302 | 3/1976 | Johnston | 179/100.4 C |

Primary Examiner—L. T. Hix
Assistant Examiner—Alan Mathews
Attorney, Agent, or Firm—Eugene M. Whitacre; W. H. Meagher

[57] ABSTRACT

Apparatus provides an incident light beam which illuminates the surface of a resist coated grooved disc, having an exposure pattern of signal elements formed within the groove, with a light spot that spans a plurality of convolutions of the groove. As the resist coating is developed, portions of the resist coating corresponding to the exposure pattern are removed and the emerging structure of the signal elements serves as a diffraction grating which diffracts the incident light beam. Photodetector apparatus positioned to intercept a selected portion of the diffracted beam provides an output corresponding to the light power in the selected portion. Means responsive to the output of the photodetector are provided for directly indicating the achievement of a desired emerging signal element geometry in the region illuminated by the light spot to thereby control the resist development process.

10 Claims, 2 Drawing Figures

U.S. Patent

Jan. 30, 1979

4,136,940

RESIST DEVELOPMENT CONTROL SYSTEM

The present invention relates generally to optical detection systems, and particularly to optical detection systems which may be employed to control the development of a resist coating having an exposure pattern of spaced apart depressions by providing continuous estimation of depression depths during the resist development process.

In one illustrative process of producing a video disc record having spiral grooves (e.g., of type described in U.S. Pat. No. 3,842,194 — Clemens), a disc master (to be used for recording) is formed by coating a copper-coated aluminum disc having grooves formed therein with a thin layer of a radiant energy sensitive material. The coated disc is mounted on a turntable of an optical recorder in the path of a finely focused beam of radiant energy that is alternated between a high intensity level and low intensity level in response to a recording signal, to expose various portions of the resist coating in the groove bottoms as the disc is rotated and translated with respect to the impinging beam to form a signal element exposure pattern. Those portions of the resist coating struck by the beam are removed by subsequent development of the resist coating. After exposure and development, the master disc has the relief pattern that is desired for the final records. Molds for making stampers for producing production line records are made from these masters. In the final stages of manufacturing a video disc, a vinyl substrate is formed with the desired relief pattern, using a stamper made from a mold; the substrate is coated with a metal by a vacuum sputtering process; the metal is coated with a styrene dielectric by a glow discharge process; and the styrene is coated with a layer of oil by an evaporation process.

In the processes for manufacturing a video disc record, such as the type supra, control of the development process for the formulation of respectively uniform signal elements is rendered difficult by the absence of direct correlation between the amount of resist coating removed during development and development time. Where recording is to be accomplished on a thick resist layer and where development of the resist is desirably arrested prior to full development (i.e., development which effects resist removal to a level where the copper coating is exposed), control over the resist development process is rendered exceedingly difficult.

Pursuant to an approach described in a copending U.S. Pat. application of W. R. Roach, Ser. No. 810,735, filed on June 28, 1977, an apparatus provides an incident light beam which illuminates the surface of a grooved disc, having signal elements recorded therein in the form of a succession of spaced apart depressions, with a light spot that spans a plurality of convolutions of the groove. The structure of the grooved convolutions serves as a diffraction grating which reflects the incident light beam into a first plurality of substantially coplanar diverging beams of light. The signal elements also serve as a diffraction grating which reflects the incident light beam into a second plurality of diverging beams of light. Photodetectors, respectively positioned to intercept several of the reflected beams provide outputs corresponding to the light power in the respective reflected beams. Means are provided for directly deriving from the photodetector outputs respective estimations of both groove and signal element depths in the region illuminated by the light spot.

In accordance with the principles of the present invention, the aforementioned signal element depth estimation approach of Roach is advantageously employed to provide means for accurate control over the development process of a resist coating of a video disc record. Advantage is taken of the correlation between the light power in a beam of light diffracted by the signal elements (e.g., a deviated first order diffracted beam) and signal element geometry to unobtrusively examine signal element geometry emerging during development. By continuously monitoring the light power at a given spatial location in the path of the deviated first order diffracted beam, the developing process can be terminated when light power reaches a given value indicative of the substantial achievement of a desired contour definition.

In further accordance with the principles of the present invention, advantage may alternatively be taken of the correlation between the light power distribution among several diffraction components of light diffracted by signal elements, the spatial locations of which components correspond to the periodicity of the signal elements, to unobtrusively examine signal geometry emerging during development. By continuously monitoring this light power distribution, the developing process can be terminated when the light power distribution corresponds to a given distribution indicative of the substantial achievement of a contour definition providing a desired playback signal system.

In accordance with one embodiment of the present invention, a cylindrical development chamber includes means for rotatably supporting a disc, leaving a major surface of the disc (i.e., the resist coated surface of a recorded master) unobstructed. An enclosure, formed at the bottom of the chamber, houses monitoring apparatus with one wall section of the enclosure comprising a transparent platform. The platform is positioned such that the major surface of a disc supported in the chamber will lie parallel to and in spaced apart relationship to the platform. The chamber also includes an opening which discharges developer fluid into the chamber so as to immerse the major surface of the disc in developer fluid.

A low power HeNe laser, positioned within the enclosure provides a light beam to illuminate, through a semi-spherical depression in the transparent platform, a small area on the resist coated disc surface. The beam is oriented such as to be located in a plane which intersects the disc along a tangent of a groove thereof. The emerging signal element geometry serves as a diffraction grating for diffracting the incident beam into deviated diffraction orders including a deviated first diffraction order. Due to the desirable illumination of a region of the disc surface intersected by the central axis of the depression, the incident, reflected and diffracted light rays are all nearly normal to the semi-spherical surface, and therefore undergo negligible refraction as they enter and leave through the transparent platform. The reflected and diffracted rays are collected by a condenser lens placed at a focal distance from the resist surface. The semi-spherical depression, by substantially reducing light refraction, advantageously reduces the need for a large numerical aperture lens otherwise necessitated by the near laser wavelength spacings of the signal elements. In the back focal-plane of the lens, the far-field diffraction pattern of the light diffracted from the emerging signal elements in the deviated first order diffraction beam is formed. This light pattern changes continuously during the development process and is monitored by photo-detection means. Readings provided by the photo-detection means provide indications of the extent of development and the development process can, therefore, be halted in response to the output of the photo-detection means.

Figure 2:
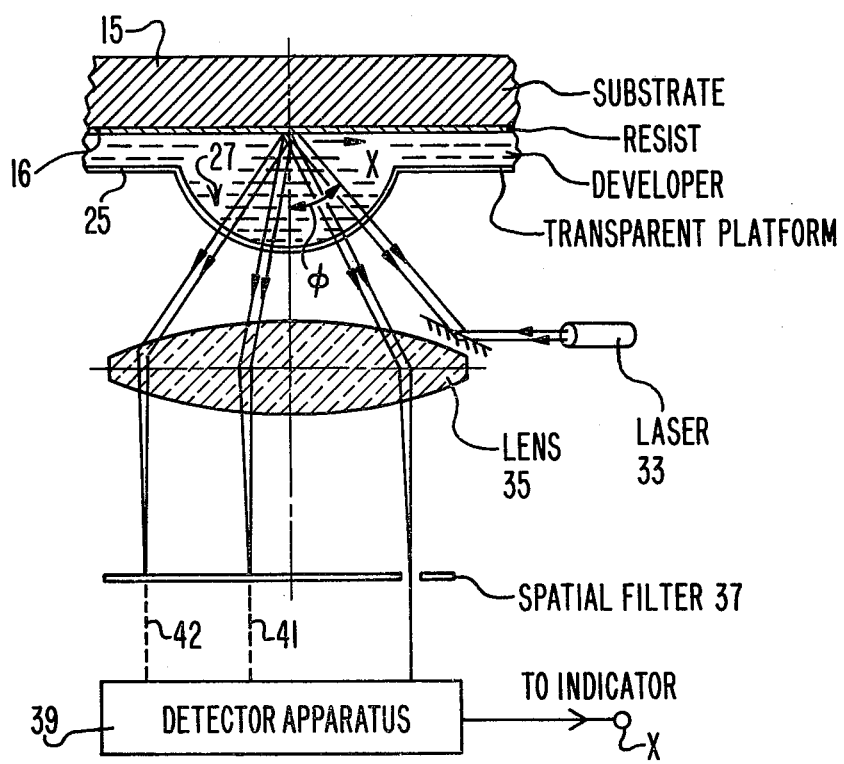

In the accompanying drawings:

FIG. 1 illustrates a resist development apparatus in accordance with an embodiment of the present invention; and FIG. 2 illustrates details of a signal element depth monitoring apparatus which is comprised within the apparatus of FIG. 1.

FIG. 1 illustrates, in accordance with one embodiment of the present invention, a cylindrical development chamber 11, which includes a ring 13 which is rotatably supported at a top opening of the chamber 11. Ring 13 is provided with a ledge for supporting a disc 15 by the edges thereof, having a major, resist coated surface 16 of the disc 15 facing the chamber unobstructed. Clamps 17 secure the disc 15 to the ring 13, while a motor 21, mechanically coupled to ring 13, causes rotation of the ring and the disc supported thereby. An enclosure 23, formed at the bottom of the chamber, houses the monitoring apparatus of the present invention. One wall section of the enclosure includes a transparent platform 25 which is positioned such that the major surface of a disc supported on ring 13 will lie parallel to and in spaced apart-relationship to the platform. The platform 25 includes semi-spherical depression 27. A conduit 29 discharges developer fluid into the chamber in sufficient quantity to effect immersion of the major surface of the disc in fluid.

The monitoring apparatus housed in enclosure 23 (shown in FIG. 2) provides an output indicative of the depth of the signal elements as the development of the resist layer progresses. The output is displayed by an appropriate means such as depth indicator 31 to enable an operator to remove the disc from the chamber at the end of the development process and to quench the disc in a neutralizer bath to arrest the development process.

In FIG. 2, details of the signal element depth monitoring system are illustrated. A low power HeNe laser 33, positioned within the enclosure, provides a light beam to illuminate, through the semi-spherical depression 27 in the transparent platform, a small area on the resist coated disc surface. The beam is oriented such as to be located in a plane which intersects the disc along a tangent of a groove thereof. The emerging signal element geometry serves as a diffraction grating for diffracting the incident beam into several diverging light beams including a deviated first order diffraction beam. Due to the desirable illumination of a region of the disc surface intersecting the axis of the depression, the incident, reflected and diffracted light beams are all nearly normal to the semi-spherical surface, and therefore undergo negligible refraction as they enter and leave through the transparent platform. The first order diffraction beam is collected by a condenser lens 35 placed at a focal distance from the resist-coated major surface 16 of disc 15. The semi-spherical depression 27, by substantially reducing light refraction, advantageously reduces the need for a large numerical aperture lens otherwise necessitated by the near laser wavelength spacings of the signal elements.

A spatial filter 37, interposed between lens 35 and photosensitive detector apparatus 39, enables the monitoring of individual known components of the diffracted light. For example, where the laser beam illuminates a region of the resist surface which includes a band of recorded test signal comprising a 5 MHz signal component, the known spatial location of the diffraction light component due to the 5 MHz signal component enables that component to be readily monitored. It will be appreciated, of course, that disc 15 is rotated by motor 21 (shown in FIG. 1) to provide relative motion between the developer fluid and the resist coating to improve the interaction between the resist coating and the developer fluid.

A series of experiments were conducted in which a group of nine masters, each comprising a test band including a 5 MHz signal component, were developed in accordance with the principles of the present invention. Each master was, in turn, supported on ring 13, substantially in the manner shown in FIG. 1. The chamber was filled with developer fluid, so as to immerse the resist layer of the disc, and as the disc was rotated, the light power in the 5 MHz diffraction component was monitored. The development process was subsequently stopped upon the achievement of a given light power output. To obtain an exact reading of the light power in the 5 MHz diffraction component, it being appreciated that during development the light power is continually changing, the master was remounted on ring 13 of the apparatus of FIG. 1 in which the developer fluid was replaced with distilled water. A predicted signal amplitude was calculated from the measured diffraction light power by comparison with and extrapolation from similar diffraction light measurement of reference substrates comprising a 5 MHz signal component whose signal element contour (e.g., the depth of the recorded pit regions) were determined by scanning electron microscope techniques. The actual signal element contour of each developed master was also determined by the same scanning electron microscope techniques.

The resulting data was as follows:

| Substrate Number | 5 MHz SIGNAL AMPLITUDE (Å) | | Development time Seconds |
|---|---|---|---|
| | Predicted | Actual | |
| 1112 | 890 | 800 | 230 |
| 1113 | | | |
| 1114 | 870 | 900 | 240 |
| 1115 | 880 | 800 | 180 |
| 1116 | | | |
| 1117 | 930 | 800 | 330 |
| 1118 | 870 | 900 | 190 |
| 1119 | 840 | 800 | 180 |

Data for substrates No. 1113 and No. 1116 is left blank in the above table since improper focusing of the electron beam during the recording of these masters precluded achievement of the desired signal element structure.

The results shown above indicate the existence of wide variations in the development times necessary to reach the given light power output of the 5 MHz diffraction component. While the reason for these variations is not clearly understood, it will be appreciated that the signal amplitudes, in the relevant developed masters, were controlled to within a range which is not far from the probable error (i.e., ± 50Å) inherent in the scanning electron microscope measurements.

While the principles of the present invention have been illustrated with respect to apparatus which monitors beam power in only one of the light diffraction components, it will be appreciated that the principles of the present invention find equal application to apparatus which monitors beam powers in a respective plurality of light diffraction components which correspond to the frequency components of a recorded signal comprising recurring bursts of carrier waves at each of a plurality of frequency components (e.g., as illustrated by broken lines 41, 43 in FIG. 2, other light diffraction components may be detected through provision of detector apparatus having several detectors and providing that appropriate slots formed in filter 37). The development process can then be controlled in accordance with other criterion such as relative light power distribution in the respective monitored light diffraction components.

What is claimed is:

1. Apparatus, for control of the development process of a resist layer, a surface of which resist layer has been partially altered by an exposure pattern yielding upon development of the resist layer depressed areas alternating, at predetermined periodicity, with relatively non-depressed areas, in a given region of said surface; said apparatus comprising:

means for effecting developer fluid contact with said resist layer;

means, providing a beam of light, for illuminating a portion of said region of the resist layer surface, the illuminated portion being sufficiently large to span a plurality of said depressed areas;

the structure of the emerging depressed areas in the illuminated portion serving as a diffraction grating for diffracting light incident upon said illuminated portion;

means for detecting light power contained in a selected portion of the diffracted light; and means responsive to the output of said detecting means for indicating achievement of a desired degree of development of said resist layer.

2. Apparatus in accordance with claim 1 wherein said detecting means includes:

a photodetector disposed in the path of the diffracted light; and a spatial filter interposed in the path of the diffracted light between said resist coating and said photodetector in manner which effects light passage of said selected portion of the diffracted light to the exclusion of other portions thereof.

3. Apparatus in accordance with claim 1 further comprising:

means for establishing relative motion between said resist layer and said beam of light.

4. Apparatus in accordance with claim 1 further comprising:

a transparent platform comprising a semispherical depression; and means for supporting said resist layer in a manner causing it to be in spaced apart relationship with said platform, with the resist layer surface altered by the exposure pattern facing said platform; and wherein:

said illuminating means effects illumination of a region of the resist layer which is intersected by the axis of said semi-spherical depression.

5. Apparatus in accordance with claim 4 further comprising:

means for effecting relative motion between said supporting means and said platform.

6. Method, for control of the development process of a resist layer, a region of which resist layer has been partially altered by an exposure pattern yielding upon development of the resist layer a pattern of depressed areas alternating at predetermined periodicity with relatively non-depressed areas, said method comprising the steps of:

(a) effecting developer fluid contact with said resist layer; while (b) illuminating, by means of an incident beam of light, a portion of said region of the resist layer, the illuminated portion being sufficiently large to span a plurality of said depressed areas;

(c) detecting light power contained in light diffracted by a grating formed by the structure of the emerging pattern of depressed areas in the illuminated portion of said surface region; and (d) terminating the development process of said resist layer upon the realization of a given output level of said detecting means.

7. Method in accordance with claim 6 further comprising the step of:

establishing relative motion between said resist layer and said incident beam of light during said illumination.

8. Apparatus for control of the development process of the resist layer of an information record master, a surface of which layer has been partially altered by an exposure pattern yielding upon development of the resist layer a first region comprising a pattern of depressed areas alternating with relatively non-depressed areas, with a varying periodicity for said alternations, and a second region comprising depressed areas alternating at predetermined periodicity with relatively non-depressed areas, said apparatus comprising:

means for effecting developer fluid contact with said resist layer;

means, providing a beam of light, for illuminating a portion of said second region of the resist layer surface, the illuminated portion being sufficiently large to span a plurality of said depressed areas;

the structure of the emerging depressed areas in the illuminated portion serving as a diffraction grating for diffracting light incident upon said illuminated portion;

means for detecting light power contained in a selected portion of the diffracted light; and means responsive to the output of said detecting means for indicating achievement of a desired degree of development of said resist layer.

9. Apparatus in accordance with claim 8 further comprising:

means for establishing relative motion between said resist layer and said beam of light.

10. Apparatus in accordance with claim 8 further comprising:

a transparent platform comprising a semispherical depression; and means for supporting said resist layer in a manner causing it to be in spaced apart relationship with said platform with the resist layer surface altered by the exposure pattern facing said platform; and wherein:

said illuminating means effects the illumination of a region of the resist layer which is intersected by the axis of said semi-spherical depression.

* * * * *